United States Patent
Ko (10) Patent No.: US 8,153,450 B2
(45) Date of Patent: Apr. 10, 2012

(54) METHOD FOR MANUFACTURING SIMOX WAFER

(75) Inventor: Bong-Gyun Ko, Tokyo (JP)

(73) Assignee: Sumco Corporation, Tokyo (JP)

( * ) Notice: Subject to any disclaimer, the term of this patent is extended or adjusted under 35 U.S.C. 154(b) by 207 days.

(21) Appl. No.: 12/695,301

(22) Filed: Jan. 28, 2010

(65) Prior Publication Data

US 2010/0197047 A1    Aug. 5, 2010

(30) Foreign Application Priority Data

Feb. 2, 2009    (JP) .................................. 2009-021421

(51) Int. Cl.
*H01L 21/00*    (2006.01)

(52) U.S. Cl. .................... 438/5; 438/407; 257/E21.529; 250/440.11; 250/492.21

(58) Field of Classification Search .............. 438/5, 407; 257/E21.529; 250/440.11, 442.11, 492.2, 250/492.21; 315/111.81
See application file for complete search history.

(56) References Cited

U.S. PATENT DOCUMENTS

| 5,608,223 | A | * | 3/1997 | Hirokawa et al. ........ 250/442.11 |
| 5,930,643 | A | | 7/1999 | Sadana et al. |
| 6,794,662 | B1 | | 9/2004 | Leavitt et al. |
| 2002/0105277 | A1 | * | 8/2002 | Tomita et al. ............ 315/111.81 |
| 2008/0187430 | A1 | * | 8/2008 | Datta et al. .................... 414/805 |
| 2009/0057811 | A1 | | 3/2009 | Murakami et al. |
| 2009/0130816 | A1 | | 5/2009 | Takahashi et al. |

FOREIGN PATENT DOCUMENTS

| JP | 9-27462 | | 1/1997 |
| JP | 09027462 A | * | 1/1997 |
| JP | 2007-005563 | | 1/2007 |
| JP | 2007-59262 | | 3/2007 |
| JP | 2007-511899 | | 5/2007 |

* cited by examiner

*Primary Examiner* — Charles Garber
*Assistant Examiner* — Abdulfattah Mustapha
(74) *Attorney, Agent, or Firm* — Greenblum & Bernstein, P.L.C.

(57) ABSTRACT

At oxygen ion implanting steps in manufacture of a SIMOX wafer, a path is formed inside or on a back surface of wafer holding means, and oxygen ions are implanted while heating an outer peripheral portion of the wafer that is in contact with the wafer holding means by flowing a heated fluid through this path. An in-plane temperature of a wafer held at the time of ion implantation is prevented from becoming uneven, and in-plane film thicknesses of both an SOI layer and a BOX layer are uniformed.

8 Claims, 5 Drawing Sheets

SOI LAYER (EXAMPLE)

FIG. 7

SOI LAYER (COMPARATIVE EXAMPLE)

FIG. 8

BOX LAYER (EXAMPLE)

FIG. 9

BOX LAYER (COMPARATIVE EXAMPLE)

METHOD FOR MANUFACTURING SIMOX WAFER

BACKGROUND OF THE INVENTION

1. Field of the Invention

The present invention relates to a method for manufacturing a SIMOX wafer using wafer holding means for an oxygen ion implantation apparatus that can improve in-plane thickness uniformity of each of an SOI (Silicon on Insulator) layer and a BOX (Buried Oxide) layer of a SIMOX (Separation by Implanted Oxygen) wafer.

2. Description of the Related Art

A SIMOX technology is a technology for manufacturing a SIMOX wafer by implanting oxygen ions into a silicon substrate at a fixed depth from an ion implantation apparatus, then forming a buried oxide film (which is called a BOX layer), and restoring crystallinity of an SOI layer corresponding to an upper portion of the BOX layer based on a high-temperature heat treatment. At the present day, a method for manufacturing a commercially available SIMOX wafer is called an MLD (Modified Low Dose) method, and oxygen ion implantation is performed on two stages according to this method (see, e.g., Patent Document 1). The first oxygen ion implantation is carried out while heating a silicon wafer, and the subsequent second oxygen ion implantation is performed while reducing a temperature of the silicon wafer to a room temperature or so. In the first oxygen ion implantation, when the oxygen ion implantation is effected while heating the silicon wafer, a high-concentration layer of oxygen is formed while maintaining a silicon wafer surface in a single-crystal state. The second oxygen ion implantation is effected while reducing a temperature, thereby forming an amorphous layer. Then, a high-temperature heat treatment is carried out in a mixed gas containing oxygen and argon, and hence a BOX layer and an SOI layer are formed, thereby forming an SOI configuration.

According to this method, oxygen precipitation is effectively promoted based on an ITOX (Internal Oxidation) technology that forms the amorphous layer on the silicon wafer and further forms a defective layer thereon by the second oxygen ion implantation at a room temperature, and then changes an oxygen concentration on two stages to carry out the high-temperature heat treatment, thus providing an excellent quality of the BOX layer. That is, in the high-temperature heat treatment step, the defective layer functions to promote diffusion of oxygen. As a result of examining oxygen ion implantation conditions in further studies/developments, it has been revealed that surface roughness of the wafer and interface roughness of the SOI layer and the BOX layer can be improved by a method for heating the silicon wafer in the first oxygen ion implantation and performing preheating at a temperature lower than a wafer heating temperature at the time of the first oxygen ion implantation in the second ion implantation (see, e.g., Patent Document 2).

At present, an oxygen ion implantation apparatus used for SIMOX wafer manufacture utilizes wafer holding means whose back surface is prevented from coming into contact with a wafer or very partially brought into contact with the same and which fixes an outer peripheral portion of the wafer by holding pins and the like. When the wafer holding means adopting such a conformation is used, heating is performed by a heater provided on a back surface of the wafer as means for heating the wafer, whereby a temperature of the wafer is increased to effect ion implantation. However, according to the wafer holding means that is not brought into contact with the wafer back surface or is quite partially brought into contact with the same to hold the outer peripheral portion of the wafer, heat generated during heating or ion implantation runs from the holding pins, and a temperature of the wafer near the pins is reduced to be lower than temperatures of other portions due to a heat radiation effect of the pins, whereby a problem that a temperature of the wafer becomes uneven occurs. The unevenness of the temperature degrades film thickness distributions of the finally formed SOI layer and BOX layer. To solve this problem, there are attempts to suppress heat dissipation by using a material having low thermal conductivity for the holding pins. As one of such attempts, an invention that uses a thermosetting resin having low head conductivity as a material of the holding pins is disclosed (see, e.g., Patent Document 3). Further, as another improving method, an invention that incorporates a heater in a wafer contact portion to perform partial heating is disclosed (see, e.g., Patent Document 4).

On the other hand, there is disclosed an ion implantation apparatus that air-tightly closes an opening portion of an apparatus main body with a cover body having a mount for a processing target provided thereon, discharges air in the thus obtained airtight atmosphere to form a vacuum, then performs ion implantation processing with respect to the processing target while flowing a refrigerant through a flow path formed in the mount to cool the processing target on the mount, restores the airtight atmosphere to barometric atmosphere and opens the cover body after ion implantation processing, and replaces the processing target on the mount (see, e.g., Patent Document 5). In this ion implantation apparatus, heat medium supplying means for supplying a heat medium to the flow path is provided. Furthermore, this apparatus is configured to perform switching control over a fluid in the flow path in such a manner that a control unit supplies the heat medium to the flow path from the heat medium supplying means in place of the refrigerant while the cover body is still opened. In the thus configured ion implantation apparatus, since the heat medium is supplied from the heat medium supplying means to the flow path to heat the mount while the cover body is opened, adsorption of moisture onto the mount surface is reduced. As a result, it is possible to decrease a time required for discharging air to form a vacuum after the cover body is closed.

Patent Document 1

Specification of U.S. Pat. No. 5,930,643 (claims 1, 6, 7, 14, and 15)

Patent Document 2

Japanese Patent Application Laid-open No. 2007-5563 (KOKAI) (claims 1 and 2, paragraphs [0011] to [0017], FIGS. 2 and 3)

Patent Document 3

PCT National Publication No. 2007-511899 (claims 1, 17, 19, and 21, paragraphs [0013] to [0015] and [0045] to [0049])

Patent Document 4

Japanese Patent Application Laid-open No. 2007-59262 (claims 1 to 3, paragraphs [0017] to [0022])

Patent Document 5

Japanese Patent Application Laid-open No. 1997-27462 (claim 2, paragraph [0008])

As described above, the oxygen ion implanting steps in manufacture of a SIMOX wafer have a problem that heat generated during the oxygen ion implantation runs from the holding pins of the wafer holding means, a temperature of the wafer near the pins is reduced as compared with other portions to provide non-uniform in-plane temperature distribution of the wafer, and film thickness distributions of the finally formed SOI layer and BOX layer are thereby degraded. In particular, this problem is prominent in the second oxygen ion implanting step that is carried out while reducing the temperature in the MLD method. Patent Documents 3 and 4 disclose countermeasures against this problem.

However, according to the invention disclosed in Patent Document 3, since a coefficient of thermal conductivity is not zero even if a thermosetting resin is used, heat dissipation from the wafer holding portion cannot be completed blocked, and fundamental means for solving the problem is not provided as the case stands. The invention disclosed in Patent Document 4 has a problem that using a partial heater to accurately heat the contact portion alone is difficult. Moreover, the invention disclosed in Patent Document 5 has a problem that an in-plane temperature of the wafer becomes uneven since the mount that holds the processing target is not heated but cooled at the time of ion implantation.

SUMMARY OF THE INVENTION

It is an object of the present invention to provide a method for manufacturing a SIMOX wafer by which an in-plane temperature of the wafer held at the time of ion implantation can be suppressed from becoming uneven and in-plane film thicknesses of both an SOI layer and a BOX layer can be made uniform.

According to one aspect of the present invention, there is provided a method for manufacturing a SIMOX wafer, the method using an ion implantation apparatus comprising: a cylindrical chamber that has a bottom wall provided on one end face and is opened at the other end face; wafer holding means for holding a plurality of wafers accommodated in the chamber on the same circumference at intervals to enable revolution of the wafers; and a discoid cap that air-tightly closes an opening portion of the chamber by a seal member, thereby performing oxygen ion implantation with respect to the wafers, wherein a path is formed inside or on a back side of the wafer holding means, and the oxygen ion implantation is carried out while heating outer peripheral portions of the wafers that are in contact with the wafer holding means by flowing a heated fluid through the path.

According to a second aspect of the present invention, there is provided the invention based on the first aspect, wherein the heated fluid is water or oil.

According to a third aspect of the present invention, there is provided the invention based on the first aspect, wherein a temperature of the heated fluid is in the range of 20° C. to 80° C.

According to a fourth aspect of the present invention, there is provided the invention based on the first aspect, wherein the heated fluid is flowed through the path of the wafer holding means to heat the outer peripheral portions of the wafers by using a heated fluid supply device comprising: a tank that stores the heated fluid; a heater that heats the heated fluid in the tank; a temperature sensor that detects a temperature of the heated fluid in the tank; a controller that controls the heater based on a detection output from the temperature sensor; and a pump that circulates the heated fluid from the tank to the wafer holding means.

According to a fifth aspect of the present invention, there is provided the invention based on the first aspect, wherein the heated fluid is flowed through the path of the wafer holding means at all or some of oxygen ion implanting steps for the wafers.

According to a sixth aspect of the present invention, there is provided the invention based on the fourth aspect, wherein the wafer holding means includes: a wafer holding substrate; an arm which is disposed on a back surface of the wafer holding substrate and has a U-shaped path for the heated fluid; one end stage which is disposed on an outer peripheral surface of the wafer holding substrate and on which the wafer outer peripheral portion is mounted; two side end stages; an end holding pin which is disposed on the end stage to fix the wafer; and side end holding pins disposed on the side end stages, the path has: an approach path extending from a proximal end toward a distal end of the arm along one side edge of the arm; a return path extending from the distal end toward the proximal end of the arm along the other side edge of the arm; and a U-shaped connection path that connects a distal end of the approach path to a proximal end of the return path, and the approach path is provided in close proximity to one of the two side end stages disposed to the wafer holding plate, the return path is provided in close proximity to the other of the two side end stages, and the connection path is provided in close proximity to the end stage disposed to the wafer holding plate.

Based on the method according to the first aspect of the present invention, since heat from the wafer can be suppressed from diffusing from the holding portion of the wafer holding means by flowing the heated fluid to the path of the wafer holding means at the oxygen ion implanting steps in manufacture of the SIMOX wafer, a temperature at the wafer outer peripheral portion can be stably maintained, and an in-plane temperature of a wafer can be prevented from becoming uneven. As a result, in-plane film thickness uniformity of each of an SOI layer and a BOX layer formed in the SIMOX wafer can be improved.

DETAILED DESCRIPTION OF THE PREFERRED EMBODIMENTS

Figure 4:
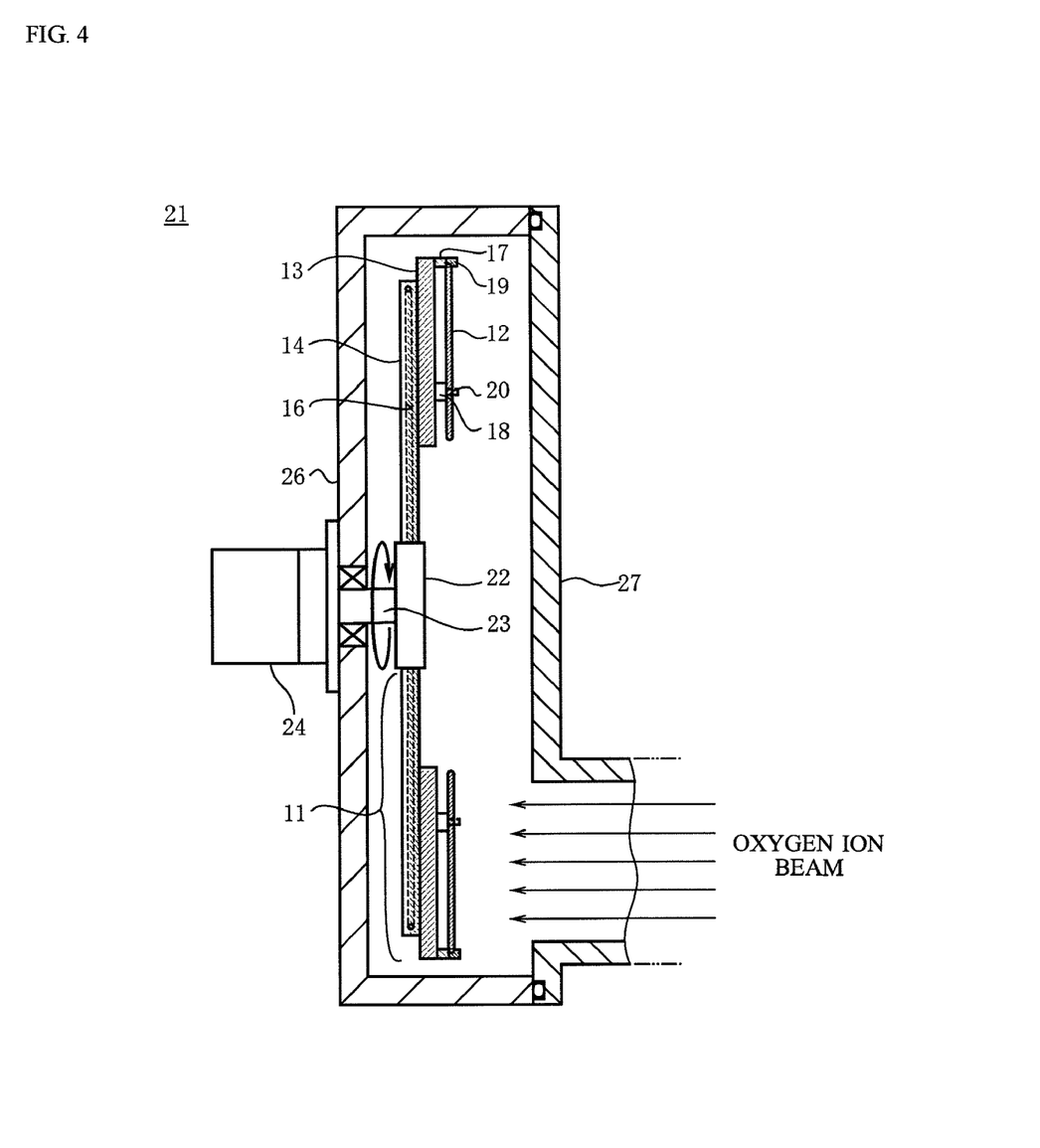
FIG. 4 is a cross-sectional structural view of an ion implantation apparatus according to the embodiment of the present invention.

Embodiments for carrying out the present invention will now be described with reference to the attached drawings hereinafter. As shown in FIG. 4, in an oxygen ion implantation apparatus 21, a cylindrical chamber 26 that has a bottom wall provided on one end face and is opened at the other end face, a discoid cap 27 that closes an opening portion of the chamber, wafer holding means 11, and a fixed plate 22 that holds a plurality of wafer holding means are disposed. 13 wafer holding means 11 are disposed at an outer periphery of this fixed plate 22 at equal intervals (see FIG. 5). This fixed plate 22 is fixed to a rotary shaft 23 rotatably inserted in the center of the bottom wall of the chamber 26, and a motor 24 is connected with this rotary shaft 23. This rotary shaft 23 is disposed to be horizontal with respect to a floor.

Figure 1:
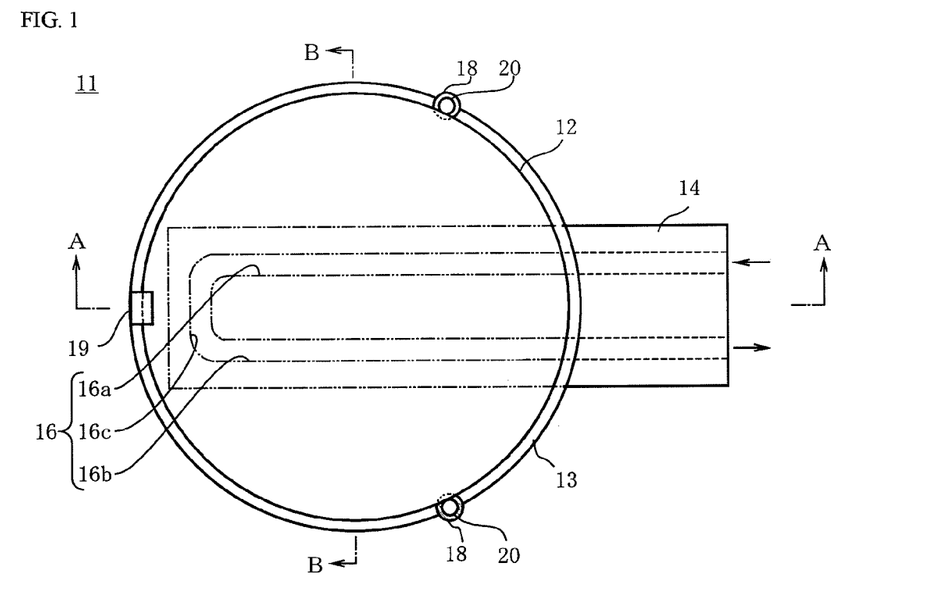
FIG. 1 is a plan view of wafer holding means according to an embodiment of the present invention.
Figure 2:
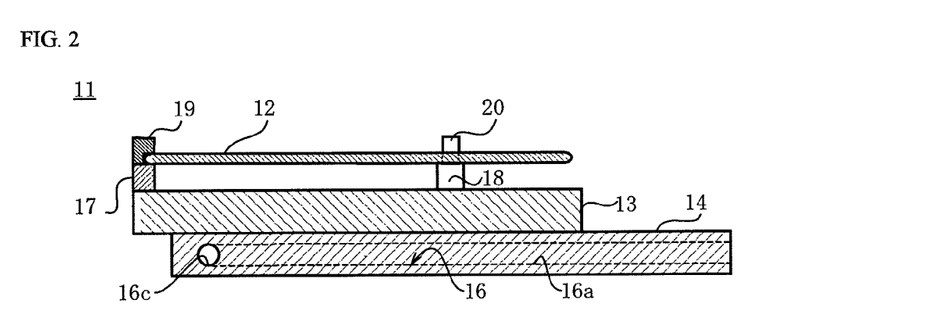
FIG. 2 is a cross-sectional view taken along a line A-A in FIG. 1.
Figure 3:
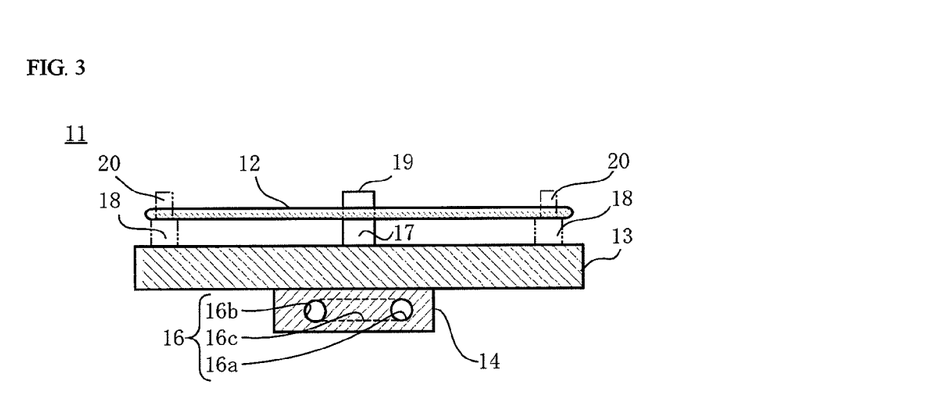
FIG. 3 is a cross-sectional view taken along a line B-B in FIG. 1.

As shown in FIGS. 1, 2, and 3, the wafer holding means 11 of an oxygen ion implantation apparatus includes a wafer holding substrate 13, an arm 14 that is provided on a back surface of the wafer holding substrate and has a U-shaped path 16 for a heated fluid therein, one end stage 17 which is disposed on an outer peripheral surface of the wafer holding substrate 13 and on which a wafer outer peripheral portion is mounted, two side end stages 18 and 18, an end holding pin 19 that is disposed on the end stage 17 to fix a wafer, and side end holding pins 20 and 20 that are disposed on the side end stages 18 and 18. The path 16 has an approach path 16a extending from a proximal end toward a distal end of the arm 14 along one side edge of the arm 14, a return path 16b extending from the distal end toward the proximal end of the arm 14 along the other side edge of the arm 14, and a U-shaped connection path 16c that connects a distal end of the approach path 16a with a proximal end of the return path 16b (FIGS. 1 to 3 and FIG. 5). The approach path 16a is provided in close proximity to one side end stage 18 of the two side end stages 18 and 18 disposed to the wafer holding plate 13, the return path 16b is provided in close proximity to the other side end stage 18 of the two side end stages 18 and 18, and the connection path 16c is provided in close proximity to the end stage 17 disposed to the wafer holding plate 13.

Figure 5:
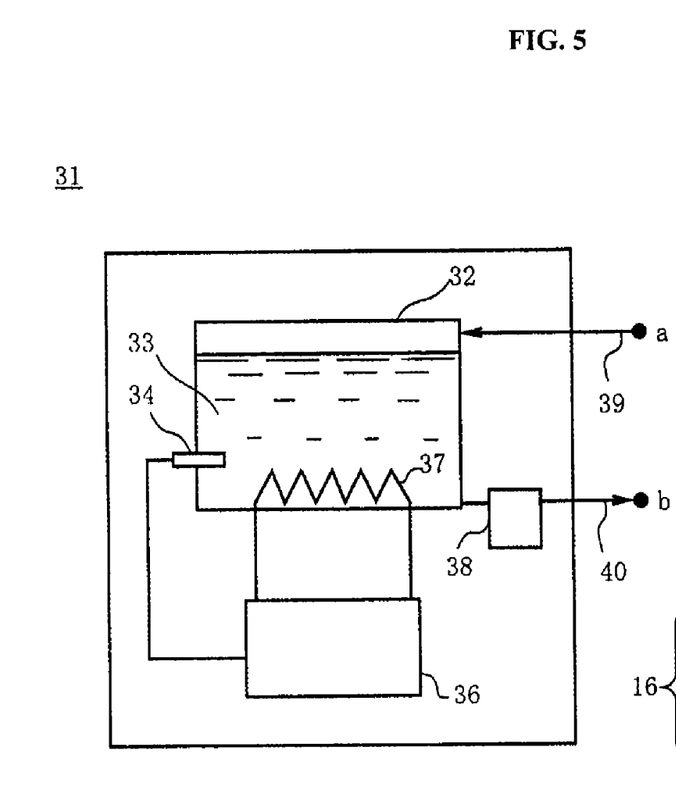
FIG. 5 is a schematic view of the wafer holding means and a heated fluid supply device according to the embodiment of the present invention.

As shown in FIG. 5, a heated fluid supply device 31 is connected to the 13 wafer holding means 11. A right-hand side portion in FIG. 5 is a view showing the 13 wafer holding means 11 from the back side. Inlet/outlet openings of the respective paths 16 of the 13 wafer holding means 11 are connected in series. A heated fluid lead-in opening 39 of the heated fluid supply device 31 depicted in a left-hand side portion in FIG. 5 is connected with a heated fluid outlet opening of each of the paths 16 connected in series through a pipe, and a heated fluid lead-out opening 40 of the heated fluid supply device 31 is connected with an inlet opening of each of the paths 16 connected in series. The heated fluid supply device 31 has a tank 32 that stores a heated fluid 33, a heater 37 that heats the heated fluid in this tank, a temperature sensor 34 that detects a temperature of the heated fluid in the tank, a controller 36 that controls an output for heating the heater based on a detected output from this temperature sensor, and a pump 38 that circulates the heated fluid 33 from the tank 32 to the wafer holding means 11. It is preferable to adopt warm water as this heated fluid 33 since it is easy to use. Additionally, oil such as a silicone oil or Dowtherm A (a registered trademark of The Dow Chemical Company) can be also used. That is because such oil is present as a liquid in the wider temperature range (15 to 257° C. in case of Dowtherm A) and it is very stable. It is preferable to set a temperature of the heated fluid 33 to a predetermined temperature in the range of 20° C. to 80° C. A heating effect is poor when this temperature is less than a lower limit value, and excessive heat is given to a wafer when this temperature exceeds an upper limit value. A more preferable temperature is 30 to 70° C.

A method for manufacturing a SIMOX wafer by using the thus configured ion implantation apparatus 21 will now be described. First, in a state that the opening portion of the chamber 26 in the ion implantation apparatus 21 depicted in FIG. 4 is opened, 13 wafers 12 are fixed to the 13 wafer holding means 11. Specifically, the wafer 12 is transferred in parallel to a surface of the wafer holding substrate 13 of each wafer holding means 11 depicted in FIGS. 1, 2, and 3, a wafer outer peripheral portion is mounted on the end stage 17 and the side end stages 18 and 18, and then the wafer outer peripheral portion is fixed against the end holding pin 19 and the side end holding pins 20 and 20.

Then, the cap 27 is disposed to the opening portion of the chamber 26 to form a vacuum in the chamber by using a vacuum pump. After a degree of vacuum reaches an ultimate vacuum, the heated fluid supply device 31 shown in FIG. 5 is operated. On the other hand, the motor 24 of the ion implantation apparatus 21 depicted in FIG. 4 is operated to cause revolution of the 13 wafer holding means 11 disposed to the fixed plate 22. When the motor 24 drives the rotary shaft 23 to rotate, the fixed plate 22 rotates, and the 13 wafer holding means 11 revolve about the rotary shaft 23 based on this rotation. Each wafer 12 is held by the end holding pin 19 and the two side end holding pins 20 and 20 of each wafer holding means 11 based on this revolution, and the wafer 12 is pressed by the end holding pin 19 based on a centrifugal force, whereby it does not come off.

When the heated fluid supply device 31 is operated, the heated fluid 33 subjected to temperature control circulates in the path 16 of each wafer holding means 11. Further, the controller 36 controls an output for heating the heater 37 based on a detection output from the temperature sensor 34 in the heated fluid supply device 31, thereby maintaining the heated fluid 33 in the tank 32 at a predetermined temperature.

When oxygen ions are implanted into each wafer 12 in this state and the heated fluid 33 circulates in the path 16 of the water holding means 11 from the heated fluid supply device 31, the end holding pin 19 and the side end holding pins 20 and 20 are heated through the end stage 17 and the side end stages 18 and 18. That is, one side end holding pin 20 is efficiently heated through one side end stage 18 when the heated fluid 33 passes through approach path 16a provided in close proximity to one side end stage 18, the end holding pin 19 is efficiently heated through the end stage 17 when the heated fluid 33 passes through the connection path 16c provided in close proximity to the end stage 17, and the other side end holding pin 20 is efficiently heated through the other side end stage 18 when the heated fluid 33 passes through the return path 16b provided in close proximity to the other side end stage 18. As a result, heat of each wafer generated at the time of oxygen ion implantation is not radiated from the end holding pin 19 and the side end holding pins 20 and 20, thus suppressing a temperature of each wafer from becoming uneven.

The invention according to the present invention can be used at all oxygen ion implanting steps or at some oxygen ion implanting steps in the oxygen ion implanting steps at the time of manufacture of a SIMOX wafer. Among others, using the method according to the present invention at the second oxygen ion implanting step based on the MLD method is preferable since an effect for improving in-plane film thickness uniformity of each of an SOI layer and a BOX layer can be prominently obtained.

EXAMPLES

Next, examples according to the present invention are explained together with comparative examples.

Example 1

As shown in FIG. 4, 13 silicon wafers 12 subjected to the first oxygen ion implantation were set to 13 wafer holding means 11 in a chamber 26 of an ion implantation apparatus 21, and a cap 27 was disposed to form a vacuum in the chamber 26 until an ultimate vacuum $1\times10^{-4}$ Pa is reached by a vacuum pump. Then, the heated fluid supply device 31 depicted in FIG. 5 was operated. It is to be noted that the first oxygen ion implantation was carried out at a wafer heating temperature 350° C. with accelerating energy 200 keV and an oxygen ion implantation amount $2.5 \times 10^{17}$ atoms/cm². Subsequently, a motor 24 of the ion implantation apparatus 21 was operated to cause revolution of the 13 wafer holding means 11 about a rotary shaft 23 at 350 rpm. Based on the operation of the heated fluid supply device 31, a heated fluid 33 circulated through paths of the 13 wafer holding means 11. At this moment, a preset temperature of the heated fluid 33 in the heated fluid supply device 31 was set to 70° C., and an output from a heater was controlled by a temperature sensor 34 and a controller 36 so as to provide the preset temperature ±1° C., thereby adjusting a temperature of the heated fluid. In this state, oxygen ions of $5 \times 10^{15}$ atoms/cm² were implanted into the silicon wafers 12 with the accelerating energy of 200 keV. After the end of the second oxygen ion implantation, the 13 silicon wafers 11 were taken out to be transferred to a high-temperature heat treatment furnace, and a high-temperature heat treatment of holding the silicon wafers in a mixed gas containing argon and oxygen with an oxygen partial pressure 50% at 1350° C. for 15 hours was performed. In this manner, a total of 13 SIMOX wafers were fabricated.

Comparative Example 1

A total of 13 SIMOX wafers were fabricated under the same conditions as those in Example 1 except that the heated fluid 33 was not circulated in the wafer holding means 11 at the oxygen ion implanting steps.

Comparative Text and Evaluation

Figure 6:
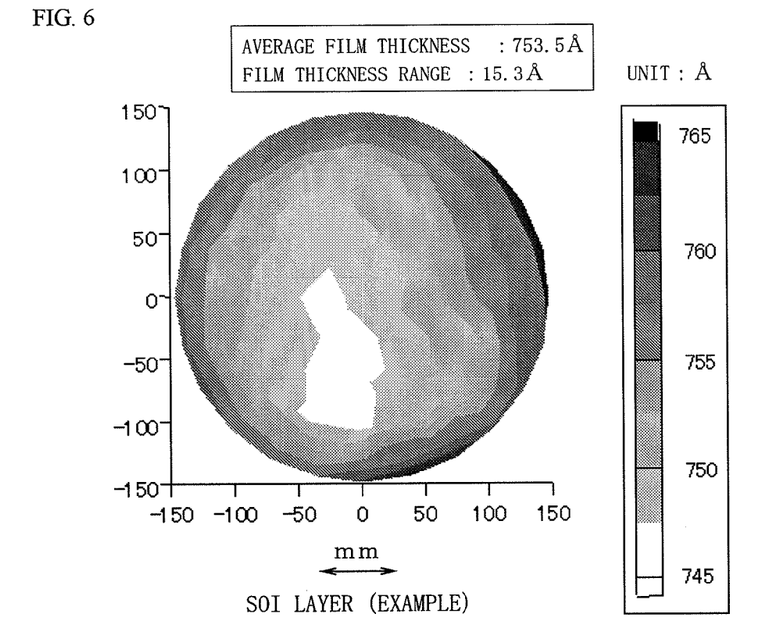
FIG. 6 is a view showing an in-plane film thickness distribution of an SOI layer according to Example 1.
Figure 7:
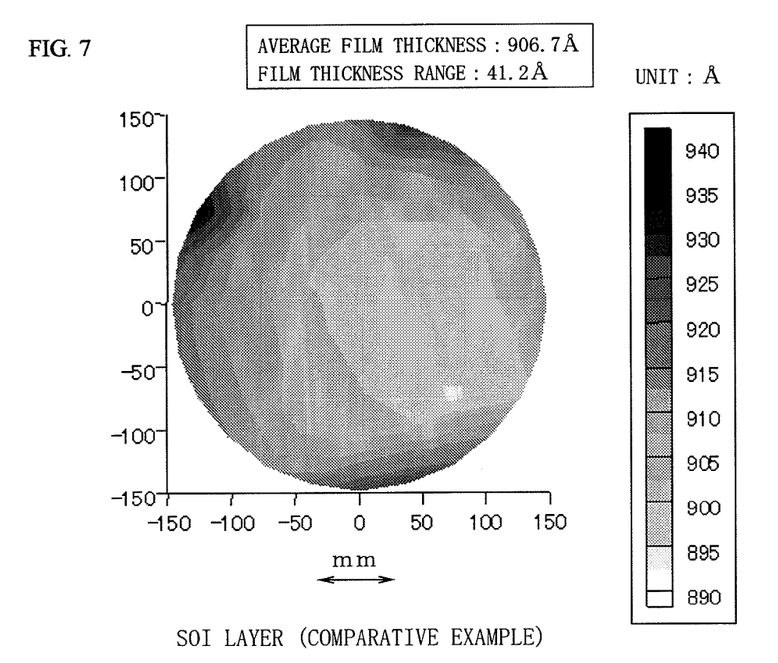
FIG. 7 is a view showing an in-plane film thickness distribution of an SOI layer according to Comparative Example 1.
Figure 8:
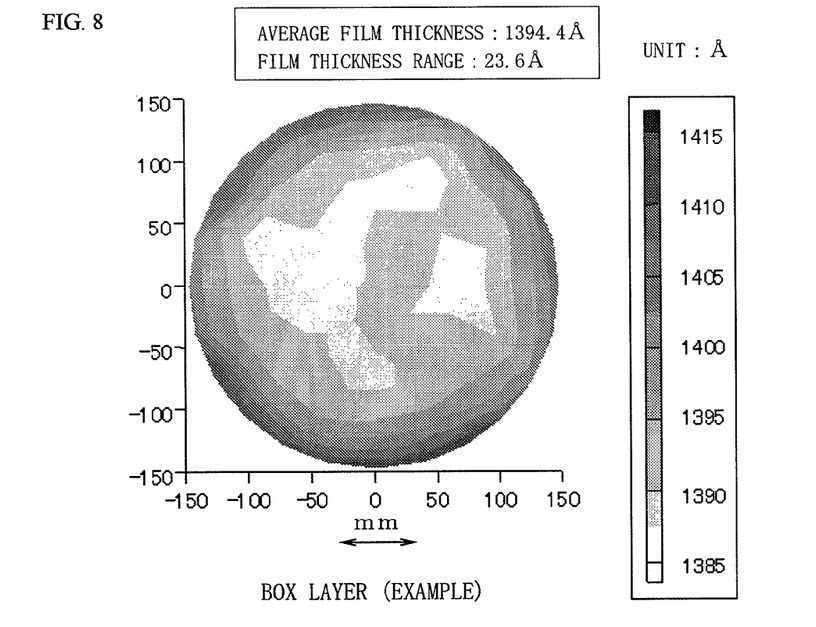
FIG. 8 is a view showing an in-plane film thickness distribution of a BOX layer according to Example 1.
Figure 9:
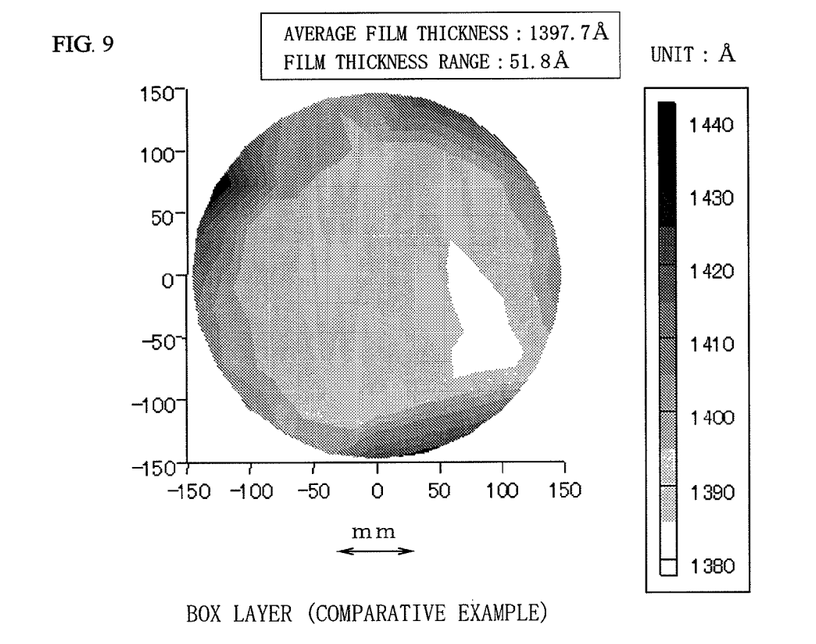
FIG. 9 is a view showing an in-plane film thickness distribution of a BOX layer according to Comparative Example 1.

In-plane film thickness distributions of an SOI layer and a BOX layer in each SIMOX wafer according to Example 1 and Comparative Example 1 were obtained. Specifically, respective thicknesses of the SOI layer portion on the entire wafer surface and the BOX layer portion on the entire wafer surface were measured, and their film thickness distributions were represented in maps. FIGS. 6, 7, 8, and 9 show results. Furthermore, an average film thickness (angstrom) and a film thickness range (angstrom) that is a value obtained by subtracting a minimum thickness from a maximum thickness were shown on an upper side in each map. Each of FIGS. 6 and 7 is a map of an in-plane film thickness distribution of an SOI layer in a typical SIMOX wafer according to each of Example 1 and Comparative Example 1. Moreover, each of FIGS. 8 and 9 is a map of an in-plane film thickness distribution of a BOX layer in a typical SIMOX wafer according to each of Example 1 and Comparative Example 1. It is to be noted that the film thickness measurement was carried out with respect to a 57-point wafer at a central portion obtained by removing a portion having a width of 3 mm from a wafer peripheral edge by using an ASET-F5x device manufactured by KLA-Tencor Corporation.

As obvious from Comparative Example 1 (FIGS. 7 and 9), a tendency that the film thicknesses of both the SOI layer and the BOX layer near the end holding pin and the side end holding pins at two positions considerably increase was observed. On the other hand, as obvious from Example 1 (FIGS. 6 and 8), the tendency that the film thicknesses of both the SOI layer and the BOX layer near the end holding pin and the side end holding pins at two positions considerably increase was not observed. Specifically, comparing the film thickness range of the SOI layer according to Example 1 with that according to Comparative Example 1 (FIGS. 6 and 7), the film thickness range was 15.3 angstrom in Example 1, and it was 41.2 angstrom in Comparative Example 1. Moreover, comparing the film thickness range of the BOX layer according to Example 1 with that according to Comparative Example 1 (FIGS. 8 and 9), the film thickness range was 23.6 angstrom in Example 1, and it was 51.8 angstrom in Comparative Example 1. Based on these results, both the film thickness range of the SOI layer and film thickness range of the BOX layer according to Example 1 were smaller than those according to Comparative Example 1. That is, it was revealed that the method according to Example 1 can reduce film thickness unevenness in the entire wafer and improve in-plane film thickness uniformity as compared with the method according to Comparative Example 1.

What is claimed is:

1. A method for manufacturing a SIMOX wafer, the method using an ion implantation apparatus comprising: a cylindrical chamber that has a bottom wall provided on one end face and is opened at the other end face; wafer holding means for holding a plurality of wafers accommodated in the chamber on the same circumference at intervals to enable revolution of the wafers; and a discoid cap that air-tightly closes an opening portion of the chamber by a seal member, thereby performing oxygen ion implantation with respect to the wafers, wherein:

the wafer holding means includes: a wafer holding substrate; an arm which is disposed on a back surface of the wafer holding substrate and has a U-shaped path for a heated fluid; one end stage which is disposed on an outer peripheral surface of the wafer holding substrate and on which the wafer outer peripheral portion is mounted; two side end stages; an end holding pin which is disposed on the end stage to fix the wafer; and side end holding pins disposed on the side end stages, the path has: an approach path extending from a proximal end toward a distal end of the arm along one side edge of the arm; a return path extending from the distal end toward the proximal end of the arm along the other side edge of the arm; and a U-shaped connection path that connects a distal end of the approach path to a proximal end of the return path, the approach path is provided in close proximity to one of the two side end stages disposed to the wafer holding substrate, the return path is provided in close proximity to the other of the two side end stages, and the connection path is provided in close proximity to the end stage disposed to the wafer holding substrate, the heated fluid is flowed through the path of the wafer holding means to heat the outer peripheral portions of the wafers by using a heated fluid supply device comprising: a tank that stores the heated fluid; a heater that heats the heated fluid in the tank; a temperature sensor that detects a temperature of the heated fluid in the tank; a controller that controls the heater based on a detection output from the temperature sensor; and a pump that circulates the heated fluid from the tank to the wafer holding means, and the oxygen ion implantation is carried out while heating the outer peripheral portions of the wafers that are in contact with the wafer holding means by flowing the heated fluid through the path.

2. A method for manufacturing a SIMOX wafer according to claim 1, wherein the heated fluid is water or oil.

3. A method for manufacturing a SIMOX wafer according to claim 1, wherein a temperature of the heated fluid is in the range of 20° C. to 80° C.

4. A method for manufacturing a SIMOX wafer according to claim 1, wherein the heated fluid is flowed through the path of the wafer holding means at all or some of oxygen ion implanting steps for the wafers.

5. A method for manufacturing a SIMOX wafer, the method using an ion implantation apparatus having: a cylindrical chamber that has a bottom wall provided on one end face and is opened at the other end face; a discoid cap that air-tightly closes an opening portion of the chamber by a seal member; and a wafer holder configured to hold a plurality of wafers accommodated in the chamber on the same circumference at intervals to enable revolution of the wafers, such that oxygen ion implantation with respect to the wafers is performed, the wafer holder including: a wafer holding substrate; an arm which is disposed on a back surface of the wafer holding substrate and has a U-shaped path for a heated fluid; one end stage which is disposed on an outer peripheral surface of the wafer holding substrate and on which the wafer outer peripheral portion is mounted; two side end stages; an end holding pin which is disposed on the end stage to fix the wafer; and side end holding pins disposed on the side end stages, wherein:

the U-shaped path includes: an approach path extending from a proximal end toward a distal end of the arm along one side edge of the arm; a return path extending from the distal end toward the proximal end of the arm along the other side edge of the arm; and a U-shaped connection path that connects a distal end of the approach path to a proximal end of the return path, the approach path is provided in close proximity to one of the two side end stages disposed to the wafer holding substrate, the return path is provided in close proximity to the other of the two side end stages, and the connection path is provided in close proximity to the end stage disposed to the wafer holding substrate, the heated fluid is flowed through the path of the wafer holder to heat the outer peripheral portions of the wafers by using a heated fluid supply device including: a tank that stores the heated fluid; a heater that heats the heated fluid in the tank; a temperature sensor that detects a temperature of the heated fluid in the tank; a controller that controls the heater based on a detection output from the temperature sensor; and a pump that circulates the heated fluid from the tank to the wafer holder, and the oxygen ion implantation is carried out while heating the outer peripheral portions of the wafers that are in contact with the wafer holder by flowing the heated fluid through the path.

6. The method for manufacturing a SIMOX wafer according to claim 5, wherein the heated fluid is water or oil.

7. The method for manufacturing a SIMOX wafer according to claim 5, wherein a temperature of the heated fluid is in the range of 20° C. to 80° C.

8. The method for manufacturing a SIMOX wafer according to claim 5, wherein the heated fluid is flowed through the path of the wafer holder at all or some of oxygen ion implanting steps for the wafers.

* * * * *